US008000062B2

(12) United States Patent
Boone, Jr. et al.

(10) Patent No.: US 8,000,062 B2
(45) Date of Patent: Aug. 16, 2011

(54) ENHANCED MAGNETORESISTANCE AND LOCALIZED SENSITIVITY BY GATING IN LORENTZ MAGNETORESISTORS

(75) Inventors: Thomas Dudley Boone, Jr., San Jose, CA (US); Bruce Alvin Gurney, San Jose, CA (US); Ernesto E. Marinero, Saratoga, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 458 days.

(21) Appl. No.: 12/345,795

(22) Filed: Dec. 30, 2008

(65) Prior Publication Data

US 2010/0165518 A1 Jul. 1, 2010

(51) Int. Cl.
*G11B 5/33* (2006.01)
*G11B 5/127* (2006.01)

(52) U.S. Cl. .......................... 360/313; 360/315; 360/324

(58) Field of Classification Search .................. 360/313, 360/315, 324
See application file for complete search history.

(56) References Cited

U.S. PATENT DOCUMENTS

| | | | | |
|---|---|---|---|---|
| 1,243,178 A | 10/1917 | Hoey et al. | ..... | 220/243 |
| 1,368,109 A | 2/1921 | Yamashita | ..... | 52/302.3 |
| 4,048,648 A | 9/1977 | Vinal | ..... | 357/27 |
| 4,163,986 A | 8/1979 | Vinal | ..... | 357/27 |
| 5,083,174 A | 1/1992 | Kub | ..... | 357/27 |
| 5,208,477 A | 5/1993 | Kub | ..... | 257/421 |
| 5,652,445 A | 7/1997 | Johnson | ..... | 257/295 |
| 5,920,090 A | 7/1999 | Stenberg | ..... | 257/252 |
| 6,809,514 B2 | 10/2004 | Ashley et al. | ..... | 324/251 |
| 6,850,058 B2 | 2/2005 | Doyle | ..... | 324/252 |
| 6,903,429 B2 | 6/2005 | Berndt et al. | ..... | 257/414 |
| 6,987,484 B2 | 1/2006 | Von Klitzing et al. | ..... | 343/701 |
| 7,095,070 B2 | 8/2006 | Lee et al. | ..... | 257/295 |
| 7,298,594 B2 | 11/2007 | Onogi et al. | ..... | 360/313 |
| 2005/0263751 A1 | 12/2005 | Hall et al. | ..... | 257/14 |
| 2007/0210298 A1 | 9/2007 | Finkelstein et al. | ..... | 257/9 |
| 2009/0073615 A1* | 3/2009 | Gurney et al. | ..... | 360/315 |
| 2009/0080118 A1* | 3/2009 | Gurney et al. | ..... | 360/313 |

FOREIGN PATENT DOCUMENTS

| | | |
|---|---|---|
| JP | 60263471 | 12/1985 |
| JP | 62122185 | 6/1987 |
| JP | 5037040 | 2/1993 |
| JP | 7260908 | 10/1995 |
| JP | 10223940 | 8/1998 |
| JP | 2003037311 | 2/2003 |

OTHER PUBLICATIONS

Arnett et al., "Two Drain FET Magnetic Field Sensor" IBM Technical Disclosure Bulletin.
Prost et al., "Gate-Voltage-Dependent Transport Measurements on Heterostructure Field-Effect Transistors" IEEE Transactions on Electron Devices, vol. ED-33, No. 5, May 1986.
Smet et al., "Gate-voltage control of spin interactions between electrons and nuclei in a semiconductor" Nature, vol. 415; Jan. 17, 2002.

* cited by examiner

*Primary Examiner* — Ly D Pham
(74) *Attorney, Agent, or Firm* — Zilka-Kotab, PC

(57) ABSTRACT

A Lorentz magnetoresistive sensor that employs a gating voltage to control the momentum of charge carriers in a quantum well structure. A gate electrode can be formed at the top of the sensor structure to apply a gate voltage. The application of the gate voltage reduces the momentum of the charge carriers, which makes their movement more easily altered by the presence of a magnetic field, thereby increasing the sensitivity of the sensor.

20 Claims, 4 Drawing Sheets

ENHANCED MAGNETORESISTANCE AND LOCALIZED SENSITIVITY BY GATING IN LORENTZ MAGNETORESISTORS

FIELD OF THE INVENTION

The present invention relates generally to magnetoresistive sensors employing Lorentz forces for magnetoresistive effect, and more particularly to the use of gating in such a sensor to increase magnetoresistive sensitivity and spatial resolution.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer includes a magnetic flux in the pole pieces which causes a magnetic field to fringe out at a write sap at the ABS for the purpose of within, the aforementioned magnetic impressions in tracks on the involving media, such as in circular tracks on the aforementioned rotating disk.

For some time a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conduction a sense current therethrough. The magnetization of the pinned layer is oriented generally perpendicular to the air bearing surface (ABS) and the magnetic moment of the free layer is oriented generally parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos $\Theta$, where $\Theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals. Another sensor employing the spin valve structure and using tunneling (i.e. A MAGNETIC TUNNEL JUNCTION) has also been recently employed or sensing magnetic fields from the rotating magnetic disk.

The drive for ever increased data rate and data capacity has, however, lead researchers to search for new types of magnetoresistive sensors, capable of increased sensitivity and high signal to noise ratio at decreased track widths. One type of magnetoresistive sensor that has been proposed is a magnetoresistive sensor that employs Lorentz forces to alter the path of an electrical current in a magnetoresistive sensor. Such sensors have been referred to as Lorentz magnetoresistive sensors. An advantage of Lorentz magnetoresistive sensors is that the active region of the sensor is constructed of non-magnetic semiconductor materials, and does not suffer from the problem of magnetic noise that exists in giant magnetoresistive sensors (GMR) and tunnel valves, both of which use magnetic films in their active regions.

A Lorentz magnetoresistive sensor can include a pair of voltage leads and a pair of current leads in contact with one side of the active region and an electrically conductive shunt in contact with the other side of the active region. In the absence of an applied magnetic field, sense current conducted through the current leads passes into the semiconductor active region and is shunted through the shunt. When an applied magnetic field is present, current is deflected from the shunt and passes primarily through the semiconductor active region. The change in electrical resistance due to the applied magnetic field is detected across the voltage leads. An EMR sensor is described by T. Zhou et al., "Extraordinary magnetoresistance in externally shunted van der Pauw plates", Appl. Phys. Lett., Vol. 78, No. 5, 29 January 2001, pp. 667-669.

SUMMARY OF THE INVENTION

The present invention provides a Lorentz magnetoresistive sensor that includes a quantum well structure formed between first and second semiconductor layers. An insulation layer is formed over a portion of the second semiconductor layer at a side opposite the quantum well structure, and a gate electrode is formed over the insulation layer such that the insulation layer is sandwiched between the second semiconductor layer and the gate electrode.

A voltage source can be connected with the gate electrode by an electrically conductive lead. The application of a gale voltage to the gate electrode can be used to form an electrical field in the second semiconductor. This can be used to reduce and control the momentum of charge carriers in the quantum well structure. This reduction and control of charge carrier momentum advantageously increases the sensitivity of the Lorentz magnetoresistive sensor, requiring less magnetic field to deflect the path of charge carriers in the quantum well structure.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
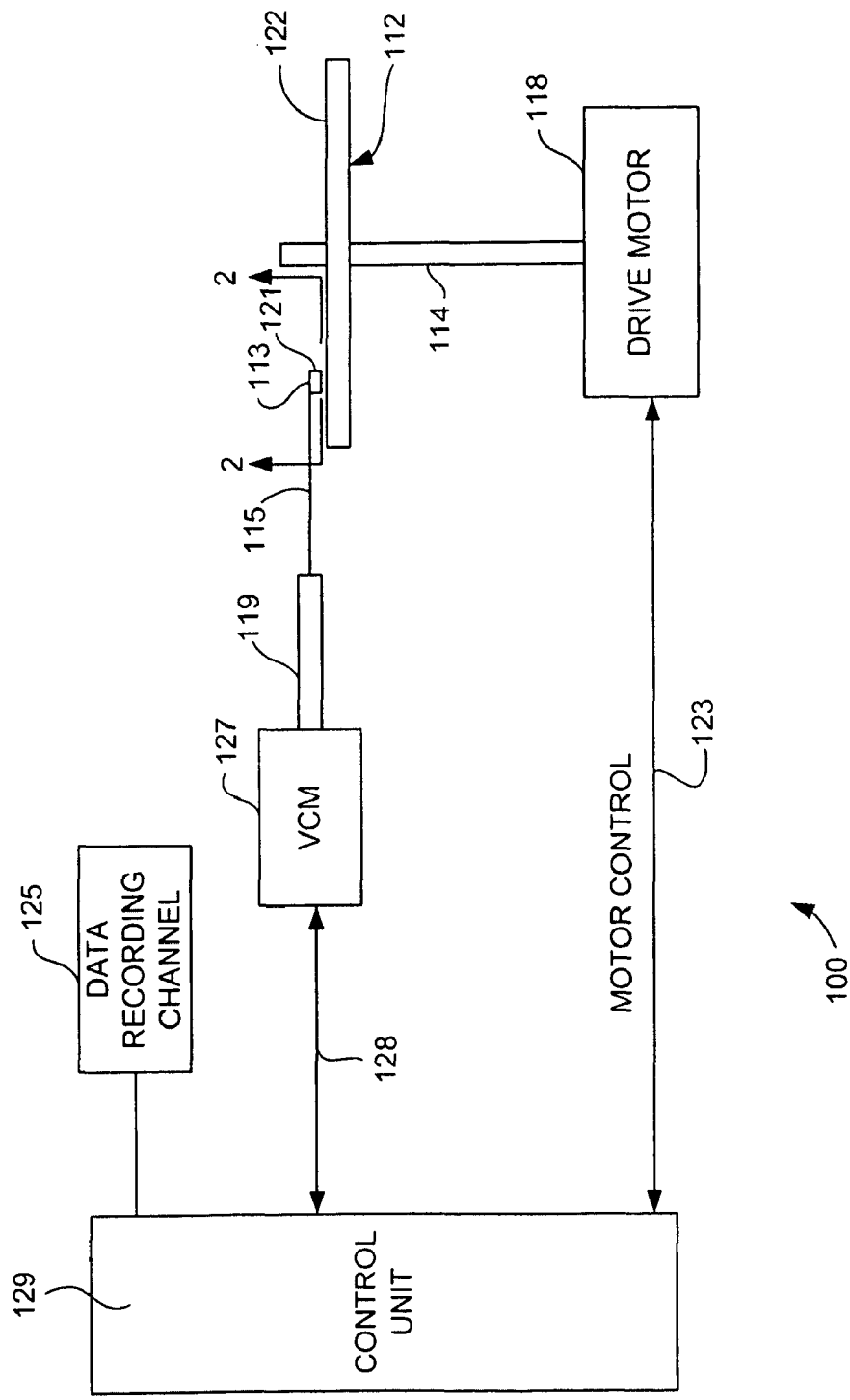
FIG. 1 is a schematic illustration of a disk drive system in which the invention might be embodied.

Referring now to FIG. 1, there is shown a disk drive 100 which could embody this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider 113. The air bearing thus counterbalances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125. The read portion of the head 121 call be an Extraordinary Magnetoresistive (EMR) sensor such as will be described below.

Figure 2:
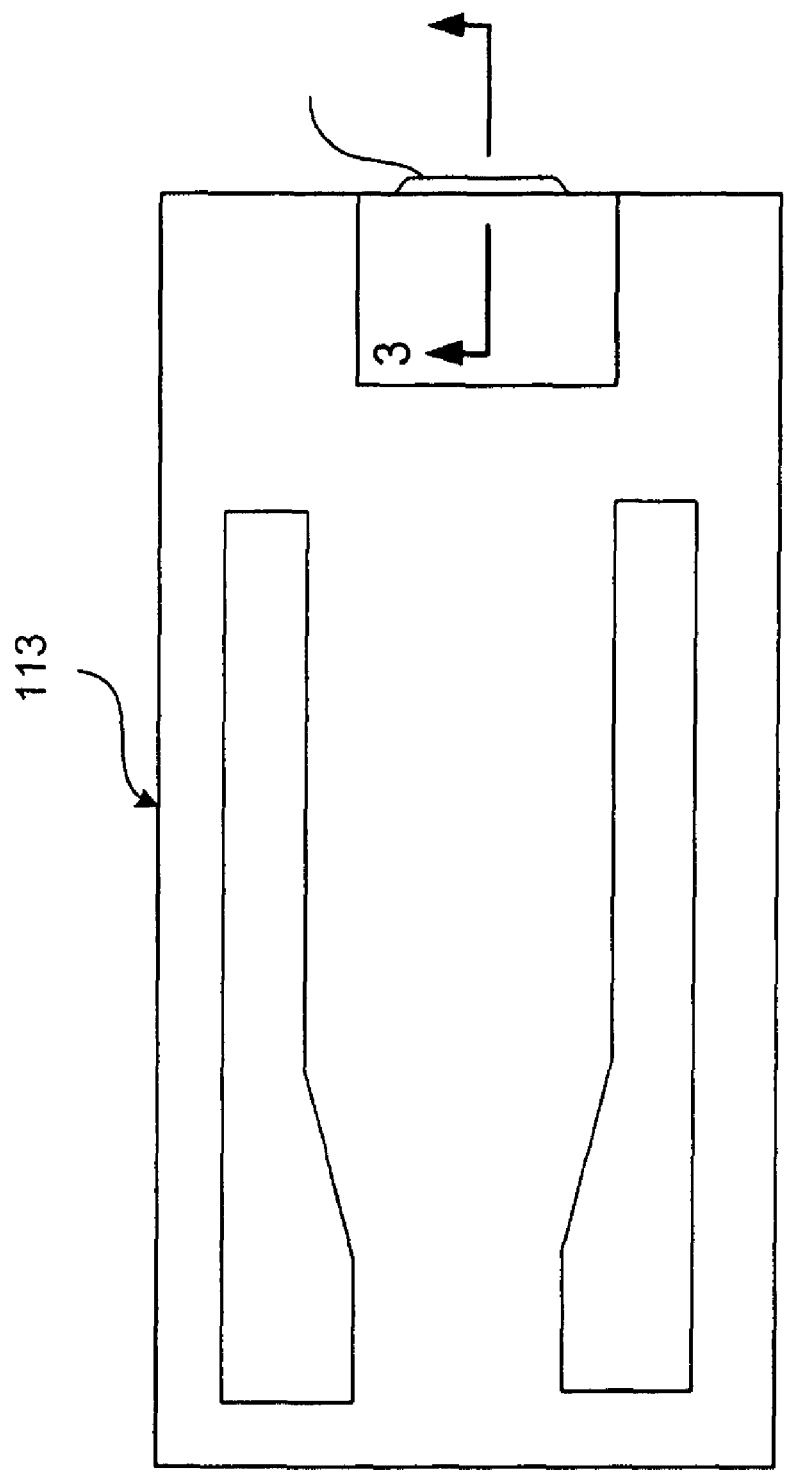
FIG. 2 is an ABS view of a slider.

FIG. 2 shows an enlarged view of the slider 113 having a magnetic head 113 formed thereon. The slider 113 is shown as viewed from the air bearing surface (ABS). The magnetic head 121 is formed on the trailing edge 202 of the slider 113, and includes a write head and a Lorentz magnetoresistive sensors which will be described in greater detail below.

Figure 3:
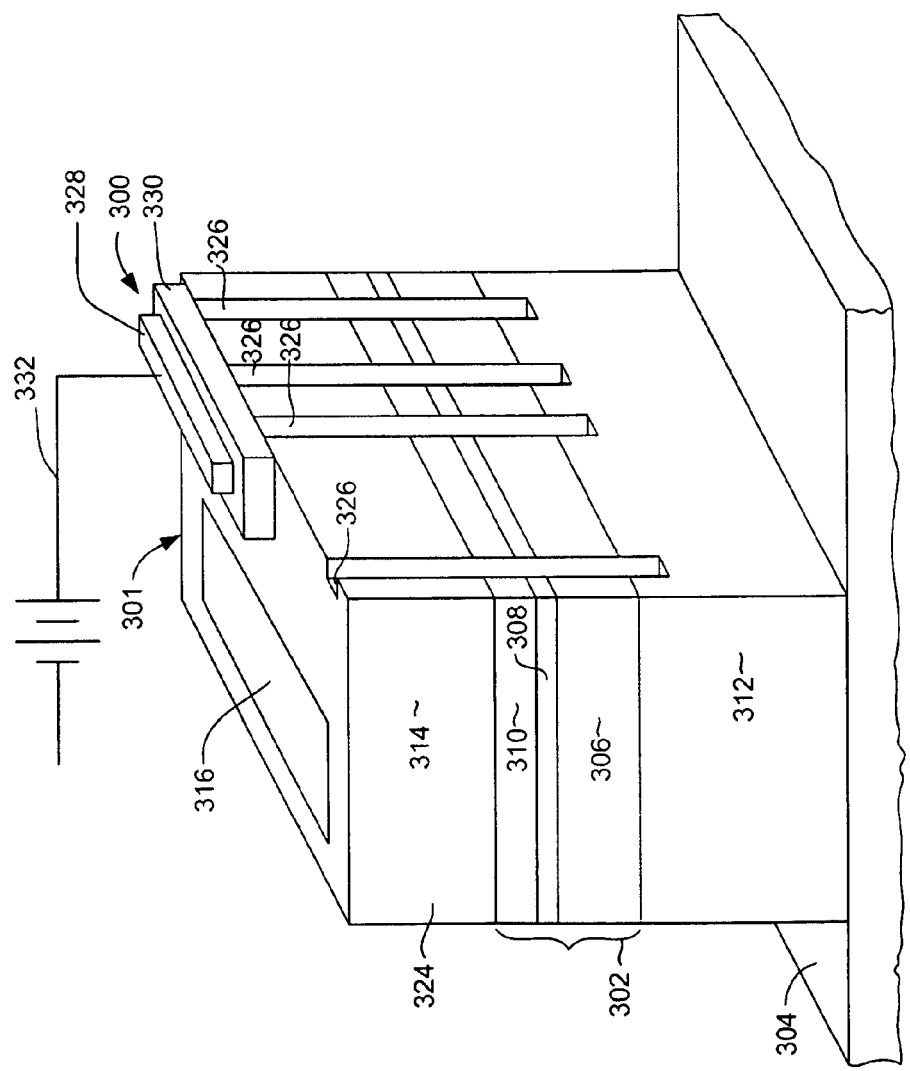
FIG. 3 is schematic isometric view of an EMR device according to an embodiment of the invention, shown with voltage and current leads removed for clarity.

With reference now to FIG. 3, a Lorentz magnetoresistive sensor 300 for use in a magnetic head 121 (FIG. 2) is shown according to a possible embodiment of the invention. The Lorentz magnetoresistive sensor 300 includes a mesa structure 301 formed on a substrate 304 such as a wafer. The mesa structure 301 includes a heterostructure 302 that includes a quantum well 308 such as a 2 Dimensional Electron Gas (2-DEG) or hole gas or other conducting layer sandwiched between first and second layers of higher resistance semiconductor layers 306, 310. The mesa structure 301 can also include a buffer layer 312 underlying the structure 302. A capping layer 314 may also be provided at the top of the mesa structure to protect the underlying layers 306-310 of the mesa structure 301. The Lorentz magnetoresistive sensor 301 also includes an electrically conductive shunt structure 316, the top end of which is shown, but which extends downward into the mesa structure 301 as will be described in greater detail herein below.

The Lorentz magnetoresistive sensor 300 may include a structure 302 that is a III-V heterostructure formed on a semiconductor substrate 304 such as GaAs. However, the Lorentz magnetoresistive sensor described in this invention is not restricted to II-V semiconductor materials. For example, it may also be formed on the basis of silicon or germanium. The heterostructure 302 can include a first layer 306 of semi-conducting material having a first band-gap, a second layer 308 of semi-conducting material formed on the first layer 306 and having a second bandgap that is smaller than that of the first layer 306, and a third semi-conducting layer 310 of semi-conducting material formed on top of the second layer 308 and having a third band gap that is greater than the second band gap. The materials in the first and third layers 306, 310 may be similar or identical. An energetic potential well (quantum well) is created by the first, second and third semi-conducting material layers 306, 308, 310 due to the different band-gaps of the different materials. Thus, carriers can be confined inside layer 308, which is considered the Lorentz magnetoresistive active film in the sensor 300. Because the layer 308 is extremely thin, and because electrons travel very fast and at very long distances without scattering, this layer 308, forms what has been referred to as a 2 Dimensional Electron Gas (2DEG) or 2 Dimension Hole Gas.

The first layer 306 is typically formed on top of a buffer layer 312 that may be one or more layers. The buffer layer 312 comprises several periods of a superlattice structure that functions to prevent impurities present in the substrate from migrating into the functional layers 306, 308, 310. In addition, the buffer layer 312 is chosen to accommodate the typically different lattice constants of the substrate 304 and the functional layers of the heterostructure 302 to thus act as a strain relief layer between the substrate and the functional layers.

One or more doped layers can be incorporated into the semiconducting material in the first layer 306, the third layer 310, or both layers 306 and 310, and spaced apart from the boundary of the second and third semiconducting materials. Dopants are also sometimes incorporated in layer 312 or 314 at locations near layers 306 or 310. The doped layers provide electrons (if n-doped) or holes (if p doped) to the quantum well. The electrons or holes are concentrated in the quantum well in the form of a two dimensional electron-gas or hole-gas, respectively.

The layers 306, 308, 310 may be a $Al_{0.09}In_{0.91}Sb/InSb/Al_{0.09}In_{0.91}Sb$ or AlSb/InAs/AlSb heterostructure grown onto a semi-insulating GaAs substrate 304 with a buffer layer 312 in between. InSb and InAs can be narrow band-gap semiconductor. Narrow band-gap semiconductors typically have a high electron mobility, since the effective electron mass is greatly reduced. Typical narrow band-gap materials are InSb and InAs. For example, the room temperature electron mobility of InSb and InAs are 70,000 $cm^2/Vs$ and 35,000 $cm^2/Vs$, respectively.

The bottom $Al_{0.09}In_{0.91}Sb$ or GaAlSb layer 306 formed on the buffer layer 312 has a thickness in the range of approximately 1-3 microns and the top $Al_{0.09}In_{0.91}Sb$ or AlSb layer 310 has a thickness in the range of approximately 2 to 1000 nm. The doping layers incorporated into layers 306, 310 have a thickness from one monolayer (delta-doped layer) up to 10 nm. The doping layer is spaced from the $InSb/Al_{0.09}In_{0.91}Sb$ boundaries of first and second or second and third semiconducting materials by a distance of 10-300 Angstrom. N-doping is preferred, since electrons typically have higher mobility than holes. The typical n-dopant is silicon with a concentration of about $1 \times 10^{19}/cm^3$. The deposition process for the heterostructure 302 is preferably molecular-beam-epitaxy, but other epitaxial growth methods can be used.

A capping layer 314 is formed over the heterostructure 302 to protect the device from corrosion. The capping layer 314 is formed of an insulating material such as oxides or nitrides of aluminum or silicon (e.g., $Si_3N_4$, $Al_2O_3$) or a non-corrosive semi-insulating semiconductor. The layers 312, 306, 308, 310, 314 together form a structure that can be referred to as a mesa structure 301.

As can be seen, in FIG. 3, the mesa structure 301 can be configured with cutout notches 326 formed in a side of the mesa structure. The notches provide a contact region for electrical leads that are not shown in FIG. 3, but which will be shown and described in subsequent figures. The leads and also an optional fill layer have been removed from FIG. 3, in order to more clearly show the mesa structure 300 and associated notches 326. As can be seen, the notches 326 extend from the top of the mesa structure 301 to a point beneath the quantum well layer 308, also referred to as the magnetically active region or 2-DEG 308, and preferably extend beyond the entire heterostructure 302. As will be seen below, the notches 326 are optional (e.g. they can be configured with a depth from the side that can vary down to zero). However, the presence of the notches increases the surface area over which the leads (not shown in FIG. 3) can make contact.

Figure 4:
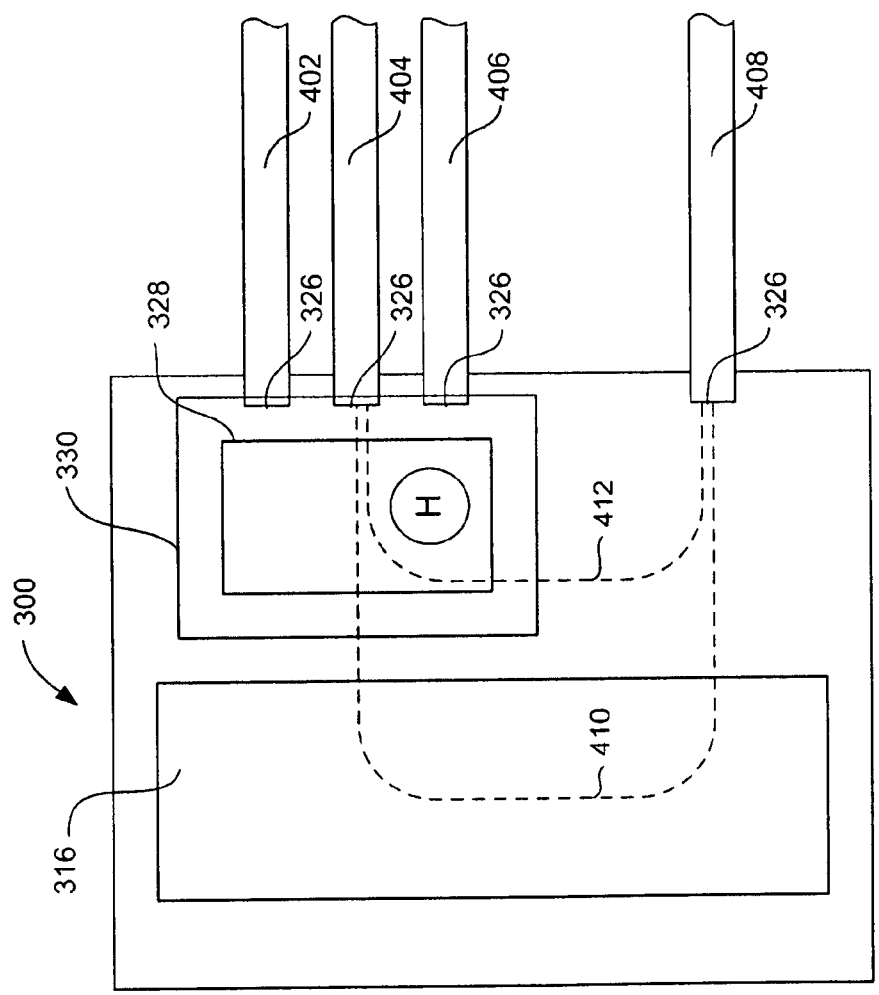
FIG. 4 is a top-down, view of the sensor of FIG. 3, shown with voltage and current leads attached.

FIG. 4, shows top down view of the sensor of FIG. 3. FIG. 4 therefore, shows the mesa structure 301 as well as the shunt 316 passing there-through. A set of electrically conductive leads 402, 404, 406, 408 extend into the notches formed in the mesa structure. The leads 402, 404, 406, 408 can be constructed of an electrically conductive material such as, for example, Au or AuGe, and can be constructed of the same material as the shunt structure 316.

With continued reference to FIG. 4, two of the leads, such as 404 and 408, are current leads for supplying a sense current to the sensor 300 and, more specifically, to the 2-DEG layer 308. Therefore, lead layer 408 can be a first current lead I1, and lead layer 404 can be a second current lead layer 12. Lead layers 406 and 402 call provide voltage leads for measuring a change in resistance associated with the presence of a magnetic field, as will be described below. Therefore, lead layer 406 can provide a first voltage lead V1 and lead layer 402 can provide a second voltage lead V2.

As mentioned above, the current leads 408, 404 provide a sense current through the sensor 300. In the absence of a magnetic field, a majority of this current (indicated by dashed line 410) passes from the first current lead 408, through a portion of the active layer 308 (FIG. 3) to the shunt structure 316. This current then passes through the shunts structure 316 with a relative low resistance before passing back through the active layer 308 back to the second current lead 404. However, in the presence of magnetic field H oriented generally perpendicular to the plane of the active layer 308, a relatively larger portion of the current is deflected from the shunt 316 to travel through the 2-DEG layer 308 as indicated by clashed line 412. This detection of carriers is due to Lorentz forces of the magnetic field on the charge carriers. The active layer 308 form is a quantum well, which traps carriers in this thin layer 308, between the layers 306, 308. This active layer 308, therefore, has a much higher resistance than the shunt layer. Therefore, when more of the carriers are forced into the active layer 308 as indicated by line 412, the electrical resistance across the voltage leads 402, 406 increases. This increased the electrical resistance can be detected by measuring a voltage across the voltage leads 406, 402.

As can be seen in FIG. 4, the leads 402-408 can extend into the notches 326. Therefore, the perimeter of contact between a lead and the notch 326 is essentially twice the depth of the notch plus the width of the lead. This increases the electrical contact area, advantageously reducing resistance between the leads 402-408 and the active layer 308. Perhaps more importantly, the leads 402-408 can be self aligned with the notches 326 and also with the shunt, by a single photolithographic step, as will be explained more fully below.

One factor that greatly affects the performance of a Lorentz magnetoresistive sensor such as the sensor 300 described above is the momentum of charge carriers in the active layer 308 and shunt 316. In a Lorentz magnetoresistive sensor the trajectories of carriers is affected by the magnetic field through the Lorentz force: $F=qv \times B$, where v is the velocity vector and B is the magnetic field vector. The change in trajectories leads to different trajectories that are detected either through a voltage induced by the charge on the carriers or by counting their current down separate paths directly. The Lorentz force leads to an acceleration "a" of the carrier perpendicular to both the velocity and magnetic field, and is of magnitude $a=F/m^*=qvB/m^*$ where $m^*$ is the carrier effective mass. Thus to optimize the Lorentz magnetoresistance signal one must consider both the carrier velocity av and its mass $m^*$ (or equivalently velocity v and momentum $p=m^*v$).

The relationship between Lorentz force and deflection in a spatially localized magnetic field can be defines as $F=qvB=ma$. The time in the device is $t=L/v$, where L is the device length over which the magnetic field is applied and v is velocity in the x-direction. The distance traveled in a y direction during that portion of the trajectory in the magnetic field is $\delta y = at^2/2 = (qvB/m) \; L/v)^2 = qBL^2/2m^*v$. The angle is approximately $\omega = \delta y/L = qBL/2m^*v$. For a device in a 0.05 T field this is $\omega = 1.6E-19 \textcircled{c} 5E-2[T] \; 20E-9[m]/2.6E02 \; 9E02[kg] \; 1E6m/s]2 = 3.4E-3 \; radians = 3.0$ degrees. Thus a reduction in $p=m^*v$ of a factor of 3-10 would greatly increase the deflection of carriers to angles that could be easily distinguished in practical devices. In the quantum regime, the relationship $\omega = \delta y/L = qBL/2m^*v$ still holds where the momentum $p=m^*v$ is replaced with $P=h/2\pi\lambda$, where $\lambda$ is the electron wavelength.

Therefore, if the momentum of the charge carriers is too high, then a higher magnetic field H is needed to deflect the charge carriers out of the shunt 316 and into the active area 302. Also, the higher velocity associated with a higher momentum means that the charge carriers spend less time in the presence of (and under the influence of) the magnetic field H. On the other hand, a charge carrier momentum that is to low means that fewer charge carriers are available to provide a magnetoresistive effect. It would be very advantageous, therefore, to be able to control the momentum of charge carriers, whether electrons or holes, to maximize the magnetoresistive sensitivity of the sensor 300.

To this end, with reference to FIGS. 3 and 4, a gate electrode 328 is provided at the top of the mesa structure 301. The gate electrode is preferably constructed of an electrically conductive metal and is separated from the mesa structure by an insulation layer 330. The gate electrode can be constructed of a conducting material such as Au, Al, Pd or titanium nitride, and the gate insulator can be constricted of an electrically insulating material such as aluminum oxide, silicon oxide, hafnium oxide or some other suitable material.

A gate voltage can be applied to the gate electrode by a voltage lead represented schematically as voltage lead line 332. Applying a voltage to the gate electrode results in an electric field between the gate electrode 328 and the active layer 308, which decreases the momentum of the charge carriers flowing through the sensor 302 (e.g. as represented by lines 410, 412. The greater the voltage applied the greater the reduction in carrier momentum. Therefore, in order to actively control the momentum of charge carriers in the active layer 308, the lead 332 can be electrically connected with a gate voltage source 334 that is preferably controllable to adjust the amount of gate voltage applied to the gate electrode 328.

In order to localize the sensitivity of the sensor, the gate electrode preferably covers an area just adjacent to the voltage electrodes as shown in FIGS. 3 and 4. This advantageously prevents the side reading from nearby magnetic sources, for example in nearby magnetic recording bits. This greatly increases the spatial resolution of the sensor 300, reducing the size of bits that can be accurately read. This of course allows an advantageous increase in data density. It is desirable to add the gate electrode where magnetic field most affects the trajectories of electrons, or where one wants the slowing of electrons to induce a lengthening of the time spent in the magnetic field, thereby increasing the magnetic field effect. It is also possible for the gate to be located below the device, for example in an additional conducting layer or 2DEG, or for the entire device to be back gated.

There are a variety of carrier velocities that might be appropriate for an active layer 308 constructed of, for example, InAs, InSb or graphene. They can range from 5E7 cm/s to 1E8 cm/s. Some values that have been measured for un-gated materials are:

| | |
|---|---|
| InAs, thermal velocity | 7E7 cm/s |
| In As, measured saturation velocity | 5E7 cm/s |
| InAs, theoretical saturation velocity | 1E8 cm/s |
| Graphene, theoretical saturation velocity | 1E8 cm/s. |

The application of a gate voltage 332 allows the Fermi level of the semiconductor layer 314 to be raised or lowered as desired. The velocity and momentum of the carriers can be obtained by evaluating the band structure of the material. The velocity of the charge carriers is given by $v(k_{fermi})=[(1/h) dE/dk]$ at $k=k_{fermi}$ and the effective mass is given by $m^*(k_{fermi})=h/[dE^2/dk^2]$ at $k=k_{fermi}$. Thus, one can look at the band structure for guidance regarding how a gate voltage could affect the carrier momentum. For example, the velocity of a parabolic band ill be largest near the band edge.

Therefore, as can be seen, the application and control of a gate voltage greatly increases the performance of a Lorentz magnetoresistor. While various embodiments have been described above, it should be understood that they have been presented by way of example only, and not limitation. Other embodiments falling within the scope of the invention may also become apparent to those skilled in the art. For example, although the invention has been described as providing an EMR sensor for use in a magnetic data recording system such as a disk drive, the present invention could also be used in the constructional of an EMR sensor to be used in another device such as a scanning magnetometer or in any other application where a magnetic signal can be read. Thus, the breadth and scope of the invention should not be limited by any of the above-described exemplary embodiments, but should be defined only in accordance with the following claims and their equivalents.

What is claimed is:

1. A Lorentz magnetoresistive sensor, comprising:
a quantum well structure formed between first and second semiconductor layers;
an insulation layer formed next to a portion of the second semiconductor layer at a side opposite the quantum well structure; and
a gate electrode formed next to the insulation layer such that the insulation layer is sandwiched between the second semiconductor layer and the gate electrode.

2. A Lorentz magnetoresistive sensor as in claim 1 wherein the quantum well has an edge, the magnetoresistive sensor further comprising first and second voltage leads contacting the edge of the quantum well and first and second current leads contacting the edge of the quantum well structure.

3. A Lorentz magnetoresistive sensor as in claim 1 wherein the quantum well has an edge, the magnetoresistive sensor further comprising first and second voltage leads contacting the edge of the quantum well and first and second current leads contacting the edge of the quantum well, the second current lead being located between the first and second voltage leads.

4. A Lorentz magnetoresistive sensor as in claim 1 wherein the quantum well has an edge, the magnetoresistive sensor further comprising first and second voltage leads contacting the edge of the quantum well and first and second current leads contacting the edge of the quantum well, the second current lead being located between the first and second voltage leads and the gate electrode being localized to cover an area just adjacent to the first and second voltage leads and the second current lead.

5. A Lorentz magnetoresistive sensor as in claim 1 wherein the quantum well has an edge, the magnetoresistive sensor further comprising first and second voltage leads contacting, the edge of the quantum well and first and second current leads contacting the edge of the quantum well, and wherein
the second current lead is located between the first and second voltage leads;
the first and second voltage leads are separated by a distance corresponding to a magnetic bit to be read; and
the gate electrode is localized to cover an area just adjacent to the first and second voltage leads and the second current lead.

6. A Lorentz magnetoresistive sensor as in claim 1 wherein the insulation layer comprises alumina and the gate electrode comprises Au, Al, Pd, Ru, Rh, Ta, titanium nitride or successive layers of these materials.

7. A Lorentz magnetoresistive sensor as in claim 1 further comprising an electrically conductive lead electrically connected with the gate electrode for supplying a gating voltage to the gate electrode.

8. A Lorentz magnetoresistive sensor as in claim 1 further comprising an electrically conductive lead electrically connected with the gate electrode for supplying a gating voltage to the gate electrode, the electrically conductive lead being electrically connected with a voltage source.

9. A Lorentz magnetoresistive sensor as in claim 1 further comprising an electrically conductive lead electrically connected with the gate electrode for supplying a gating voltage to the gate electrode, the electrically conductive lead being electrically connected with a voltage source that is controllable to control the amount of gate voltage to achieve a desired carrier momentum in the quantum well.

10. A Lorentz magnetoresistive sensor, comprising:
 a mesa structure including a semiconductor heterostructure that forms a magnetically active quantum well, the mesa structure having and second opposed edges and a surface extending between the first and second edges;
 first and second voltage leads connected with the first edge;
 an electrically conductive shunt structure connected with the second edge;
 an electrically insulating layer formed on the surface of the mesa structure; and
 an electrically conductive gate electrode formed on the electrically insulating layer, such that the electrically insulating layer is between the electrically conductive gate electrode and the mesa structure.

11. A Lorentz magnetoresistive sensor as in claim 10 further comprising first and second current leads connected with the first edge.

12. A Lorentz magnetoresistive sensor as in claim 10 wherein the electrically conductive gate electrode is localized to cover only an area substantially adjacent to the voltage leads.

13. A Lorentz magnetoresistive sensor as in claim 10 wherein the electrically conductive gate electrode covers only an area corresponding to a length of a magnetic bit to be sensed.

14. A Lorentz magnetoresistive sensor as in claim 10 further comprising first and second current leads connected with the first edge, and arranged such that the second current leads is between the first and second voltage leads.

15. A Lorentz magnetoresistive sensor as in claim 10 further comprising first and second current leads connected with the first edge, and arranged such that the second current leads is between the first and second voltage leads, the first and second voltage leads being separated by a distance that corresponds to a length of a magnetic bit to be sensed.

16. A Lorentz magnetoresistive sensor as in claim 1 wherein the electrically conductive gate electrode covers only an area corresponding to a length of a magnetic bit to be sensed.

17. A Lorentz magnetoresistive sensor as in claim 10 further comprising an electrically conductivity lead connected with the gate electrode for supplying a gating voltage to the gate electrode.

18. A Lorentz magnetoresistive sensor as in claim 10 further comprising an electrically conductive lead connected with the gate electrode, and a voltage source connected with the electrically conductive lead for supplying a gating voltage to the gate electrode.

19. A Lorentz magnetoresistive sensor as in claim 10 further comprising an electrically conductive lead connected with the gate electrode, and a voltage source connected with the electrically conductive lead for supplying a gating voltage to the gate electrode the voltage source being controllable to vary the amount of gate voltage applied to the gate electrode to thereby control a momentum of charge carriers in the quantum well structure.

20. A Lorentz magnetoresistive sensor as in claim 10 wherein the semiconductor heterostructure includes first, second and third semiconductor layers, the second semiconductor layer being sandwiched between the first and third semiconductor layers, the second semiconductor layer having a band-gap that is smaller than a bandgap of the first and third semiconductor layers.

\* \* \* \* \*

UNITED STATES PATENT AND TRADEMARK OFFICE
CERTIFICATE OF CORRECTION

PATENT NO. : 8,000,062 B2
APPLICATION NO. : 12/345795
DATED : August 16, 2011
INVENTOR(S) : Thomas Dudley Boone, Jr.

It is certified that error appears in the above-identified patent and that said Letters Patent is hereby corrected as shown below:

In the claims:

Column 10, Line 14, please replace "conductivity" with --conductive--

Signed and Sealed this
Twenty-eighth Day of May, 2013

Teresa Stanek Rea
*Acting Director of the United States Patent and Trademark Office*